US012693604B2

(12) United States Patent
Inose et al.

(10) Patent No.: US 12,693,604 B2
(45) Date of Patent: Jul. 28, 2026

(54) METHOD OF OBTAINING ARRAY OF PLURALITY OF REGIONS ON SUBSTRATE, EXPOSURE METHOD, EXPOSURE APPARATUS, METHOD OF MANUFACTURING ARTICLE, NON-TRANSITORY COMPUTER-READABLE STORAGE MEDIUM, AND INFORMATION PROCESSING APPARATUS

(71) Applicant: CANON KABUSHIKI KAISHA, Tokyo (JP)

(72) Inventors: Mitsuru Inose, Ibaraki (JP); Ryota Makino, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/581,896

(22) Filed: Feb. 20, 2024

(65) Prior Publication Data

US 2024/0288781 A1    Aug. 29, 2024

(30) Foreign Application Priority Data

Feb. 27, 2023    (JP) ................................. 2023-028844

(51) Int. Cl.
 *G03F 7/00*        (2006.01)
 *G03F 9/00*        (2006.01)
(52) U.S. Cl.
 CPC .... *G03F 7/706841* (2023.05); *G03F 7/70616* (2013.01); *G03F 7/70716* (2013.01); *G03F 9/7088* (2013.01)
(58) Field of Classification Search
 CPC .......... G03F 7/706841; G03F 7/70716; G03F 9/7088; G03F 7/70616; G03F 7/7085;

G03F 9/7003; G03F 9/7073; G03F 9/7092; G03F 7/70; G03F 7/70483–70541; G03F 7/70605–706851; G03F 9/00; G03F 9/70; G03F 9/7007; G03F 9/7011;

(Continued)

(56) References Cited

U.S. PATENT DOCUMENTS

2009/0150126 A1*  6/2009  Sellamanickam ....... G06N 7/01
                                                            703/2
2015/0116688 A1*  4/2015  Endo ..................... G03F 9/7003
                                                            355/72
2018/0144078 A1*  5/2018  Morvay ............. G03F 7/70875

FOREIGN PATENT DOCUMENTS

JP        S6284516 A     4/1987
JP        H06349705 A    12/1994
JP        3230271 B2     11/2001

(Continued)

OTHER PUBLICATIONS

Office Action issued in Taiwanese Appln. No. 113106084 dated Apr. 30, 2026.

*Primary Examiner* — Christina A Riddle
(74) *Attorney, Agent, or Firm* — ROSSI, KIMMS & McDOWELL LLP

(57)        ABSTRACT

A method of obtaining an array of a plurality of regions on a substrate, including obtaining position measurement data by measuring a mark assigned to each sample region among the plurality of regions on the substrate, and estimating a position of each non-measurement region excluding the sample region among the plurality of regions by using a regression model used to estimate the array from the position measurement data, wherein the regression model is a nonparametric regression model.

16 Claims, 9 Drawing Sheets

(58) Field of Classification Search
CPC .... G03F 9/7015; G03F 9/7019; G03F 9/7046;
G03F 9/7049; G03F 9/7076; G03F
9/7096; G06N 20/10
USPC ...................... 355/18, 27, 30, 52–55, 67–77
See application file for complete search history.

(56) References Cited

FOREIGN PATENT DOCUMENTS

| KR | 1020120123722 | A | 11/2012 |
| KR | 1020150050473 | A | 5/2015 |
| KR | 1020210082247 | A | 7/2021 |
| WO | 2022111945 | A1 | 6/2022 |

* cited by examiner

F I G. 1
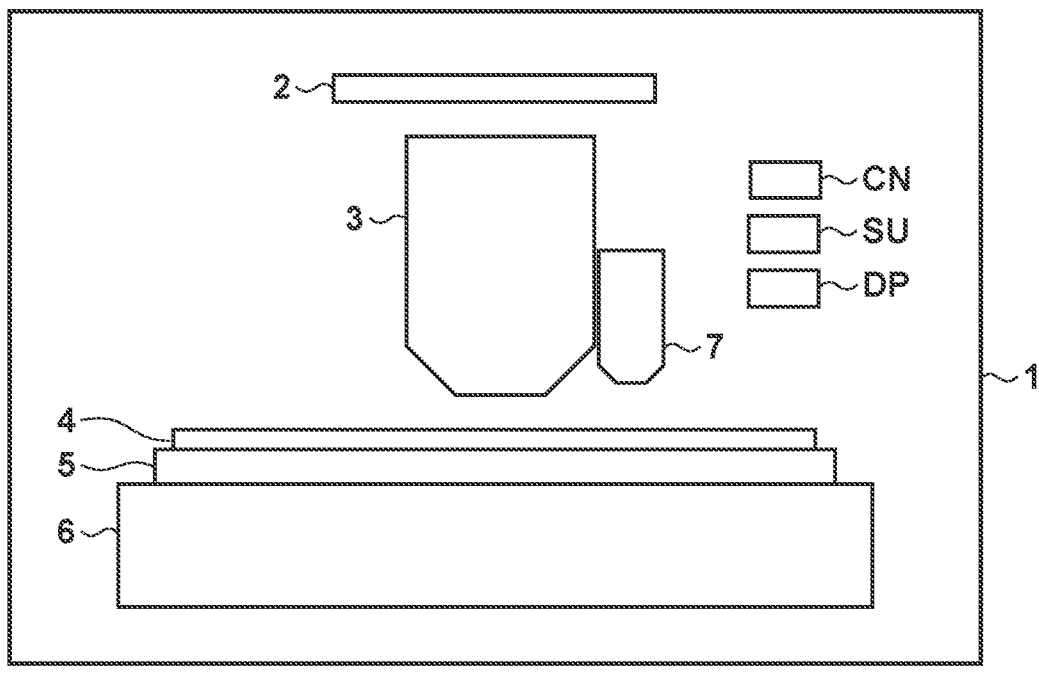
F I G. 2
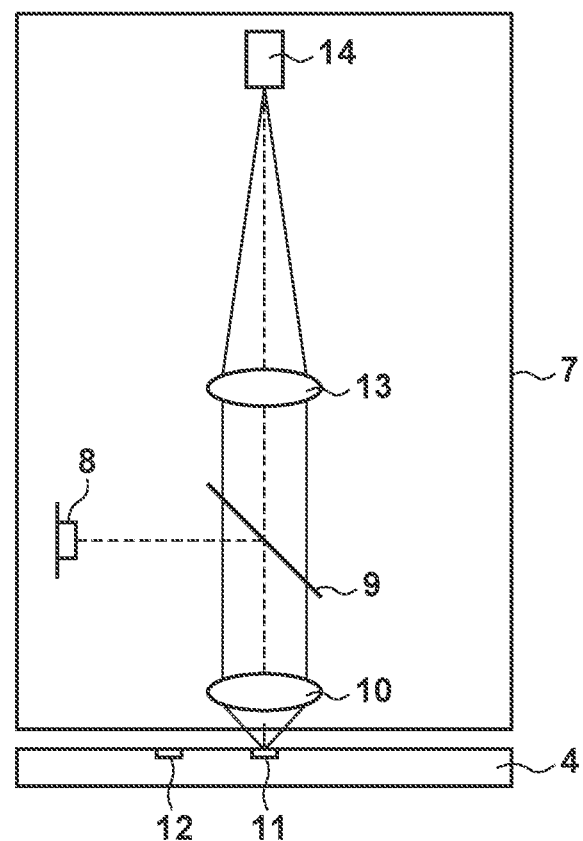

F I G. 3
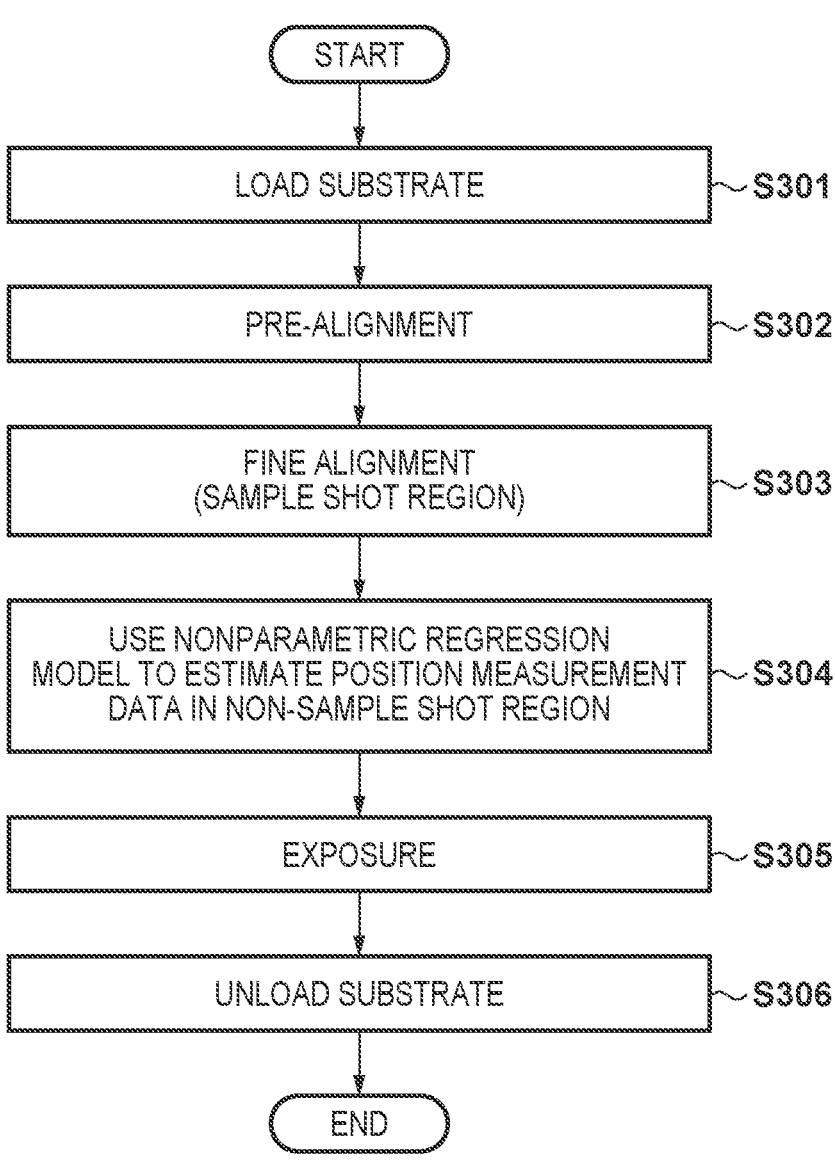
START
LOAD SUBSTRATE ~S301
PRE-ALIGNMENT ~S302
FINE ALIGNMENT
(SAMPLE SHOT REGION) ~S303
USE NONPARAMETRIC REGRESSION
MODEL TO ESTIMATE POSITION MEASUREMENT ~S304
DATA IN NON-SAMPLE SHOT REGION
EXPOSURE ~S305
UNLOAD SUBSTRATE ~S306
END

F I G.  4
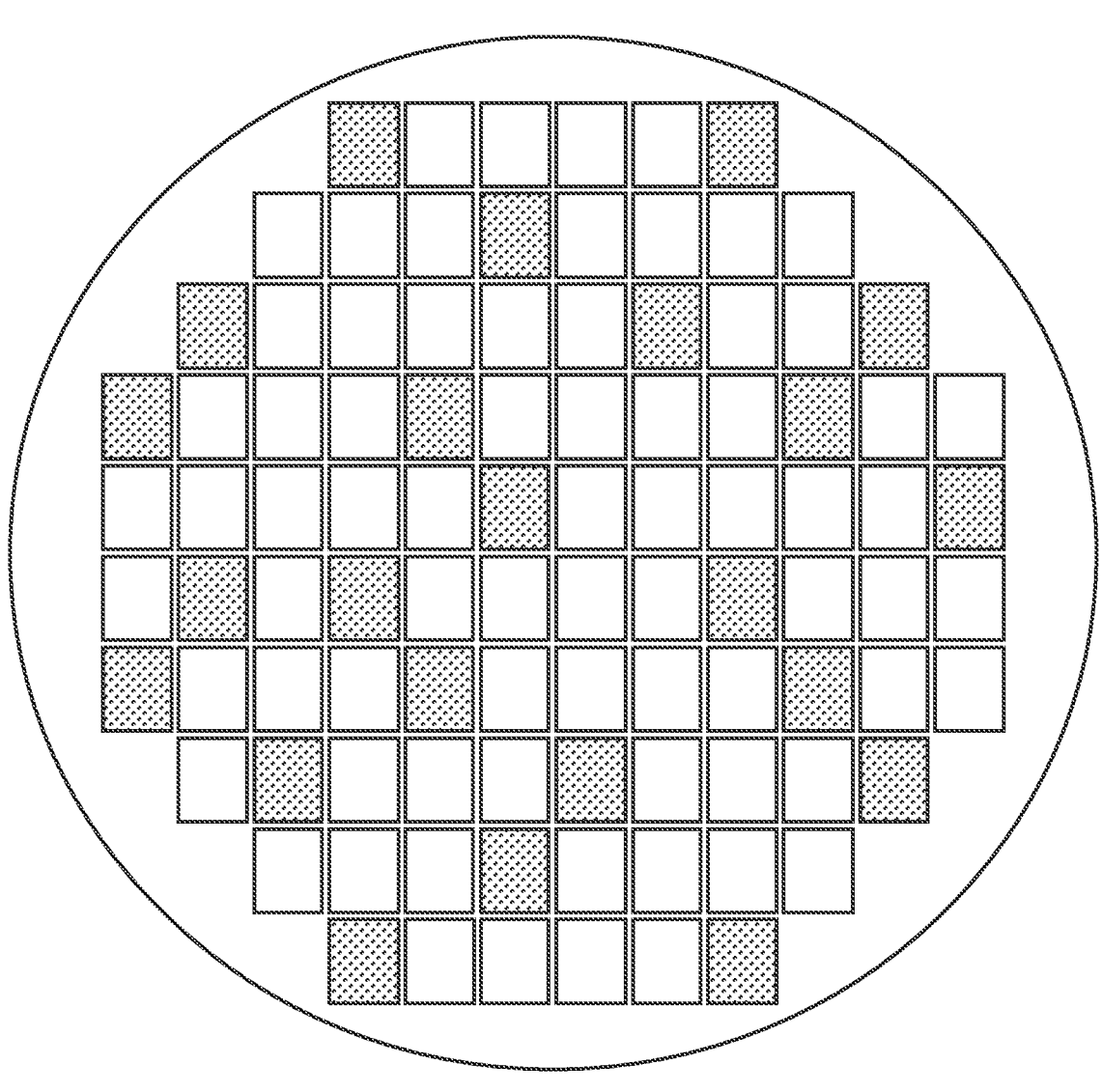
SAMPLE SHOT REGION

F I G. 5A

NUMBER OF SAMPLE SHOT REGIONS: 30

CONVENTIONAL TECHNIQUE
(5TH ORDER POLYNOMIAL
REGRESSION MODEL)

| SUBSTRATE No | 3sigma x | 3sigma y |
|---|---|---|
| 1 | 3.80 | 4.32 |
| 2 | 3.96 | 5.29 |
| 3 | 4.04 | 4.94 |
| 4 | 4.84 | 5.44 |
| 5 | 3.59 | 4.51 |
| 6 | 3.81 | 5.44 |
| 7 | 3.60 | 4.50 |
| 8 | 4.53 | 5.46 |
| 9 | 3.68 | 4.95 |
| 10 | 3.94 | 5.25 |
| 11 | 4.04 | 5.01 |
| 12 | 4.12 | 4.85 |
| 13 | 3.96 | 4.87 |
| 14 | 4.23 | 5.48 |
| 15 | 3.70 | 4.51 |
| 16 | 3.90 | 4.71 |
| 17 | 3.69 | 5.04 |
| 18 | 4.37 | 5.17 |
| 19 | 3.93 | 4.63 |
| 20 | 4.26 | 4.95 |
| 21 | 3.64 | 4.68 |
| 22 | 4.56 | 5.16 |
| 23 | 3.89 | 5.05 |
| 24 | 4.38 | 5.23 |
| 25 | 4.05 | 5.19 |
| AVERAGE VALUE | 4.02 | 4.99 |

EMBODIMENT
(GAUSSIAN PROCESS
REGRESSION MODEL)

| SUBSTRATE No | 3sigma x | 3sigma y |
|---|---|---|
| 1 | 3.45 | 3.59 |
| 2 | 3.17 | 4.60 |
| 3 | 3.69 | 4.43 |
| 4 | 4.08 | 4.94 |
| 5 | 3.15 | 4.26 |
| 6 | 3.43 | 4.73 |
| 7 | 3.62 | 4.24 |
| 8 | 3.99 | 4.64 |
| 9 | 2.88 | 4.38 |
| 10 | 3.43 | 4.40 |
| 11 | 3.83 | 4.38 |
| 12 | 3.50 | 4.11 |
| 13 | 3.78 | 4.65 |
| 14 | 3.47 | 4.83 |
| 15 | 3.48 | 3.80 |
| 16 | 3.40 | 3.93 |
| 17 | 3.26 | 4.72 |
| 18 | 3.08 | 4.64 |
| 19 | 3.34 | 4.19 |
| 20 | 3.53 | 4.44 |
| 21 | 3.32 | 4.34 |
| 22 | 3.58 | 4.74 |
| 23 | 3.78 | 3.99 |
| 24 | 3.84 | 4.65 |
| 25 | 3.46 | 4.78 |
| AVERAGE VALUE | 3.50 | 4.42 |

F I G.  5B

NUMBER OF SAMPLE SHOT REGIONS: 50

CONVENTIONAL TECHNIQUE
(5TH ORDER POLYNOMIAL
REGRESSION MODEL)

EMBODIMENT
(GAUSSIAN PROCESS
REGRESSION MODEL)

| SUBSTRATE No | 3sigma x | 3sigma y | SUBSTRATE No | 3sigma x | 3sigma y |
|---|---|---|---|---|---|
| 1 | 3.57 | 4.26 | 1 | 2.60 | 3.39 |
| 2 | 3.57 | 4.86 | 2 | 2.22 | 3.32 |
| 3 | 3.73 | 4.59 | 3 | 2.59 | 3.53 |
| 4 | 4.34 | 5.13 | 4 | 2.91 | 4.34 |
| 5 | 3.31 | 4.39 | 5 | 2.30 | 3.50 |
| 6 | 3.62 | 5.15 | 6 | 2.43 | 3.85 |
| 7 | 3.45 | 4.34 | 7 | 2.22 | 3.31 |
| 8 | 4.22 | 5.33 | 8 | 2.90 | 3.85 |
| 9 | 3.28 | 4.56 | 9 | 2.56 | 3.20 |
| 10 | 3.59 | 4.69 | 10 | 2.59 | 3.46 |
| 11 | 3.78 | 4.81 | 11 | 3.00 | 3.50 |
| 12 | 3.91 | 4.67 | 12 | 2.86 | 3.77 |
| 13 | 3.73 | 4.79 | 13 | 2.80 | 3.92 |
| 14 | 3.89 | 5.05 | 14 | 2.32 | 4.01 |
| 15 | 3.52 | 4.43 | 15 | 2.55 | 3.02 |
| 16 | 3.57 | 4.50 | 16 | 2.33 | 3.37 |
| 17 | 3.45 | 4.85 | 17 | 2.72 | 3.80 |
| 18 | 3.70 | 4.81 | 18 | 2.89 | 3.69 |
| 19 | 3.62 | 4.32 | 19 | 2.72 | 3.32 |
| 20 | 4.00 | 4.71 | 20 | 2.94 | 3.69 |
| 21 | 3.47 | 4.52 | 21 | 2.74 | 3.34 |
| 22 | 4.08 | 4.96 | 22 | 2.80 | 3.73 |
| 23 | 3.63 | 4.53 | 23 | 2.58 | 3.52 |
| 24 | 4.26 | 5.04 | 24 | 2.91 | 4.11 |
| 25 | 3.54 | 4.91 | 25 | 2.82 | 3.83 |
| AVERAGE VALUE | 3.71 | 4.73 | AVERAGE VALUE | 2.65 | 3.62 |

F I G. 5C

NUMBER OF SAMPLE SHOT REGIONS: 70

| CONVENTIONAL TECHNIQUE (5TH ORDER POLYNOMIAL REGRESSION MODEL) | | | EMBODIMENT (GAUSSIAN PROCESS REGRESSION MODEL) | | |
|---|---|---|---|---|---|
| SUBSTRATE No | 3sigma x | 3sigma y | SUBSTRATE No | 3sigma x | 3sigma y |
| 1 | 3.44 | 4.16 | 1 | 1.72 | 2.23 |
| 2 | 3.64 | 4.88 | 2 | 1.50 | 2.02 |
| 3 | 3.72 | 4.56 | 3 | 1.85 | 2.77 |
| 4 | 4.25 | 5.04 | 4 | 2.30 | 2.73 |
| 5 | 3.26 | 4.36 | 5 | 1.66 | 1.88 |
| 6 | 3.49 | 5.08 | 6 | 1.65 | 3.39 |
| 7 | 3.42 | 4.34 | 7 | 1.78 | 2.44 |
| 8 | 4.06 | 5.25 | 8 | 1.83 | 2.65 |
| 9 | 3.28 | 4.56 | 9 | 1.42 | 2.73 |
| 10 | 3.62 | 4.71 | 10 | 1.12 | 2.33 |
| 11 | 3.76 | 4.77 | 11 | 2.28 | 2.77 |
| 12 | 3.91 | 4.57 | 12 | 1.97 | 2.71 |
| 13 | 3.72 | 4.78 | 13 | 1.91 | 2.74 |
| 14 | 3.84 | 5.04 | 14 | 1.57 | 2.53 |
| 15 | 3.45 | 4.33 | 15 | 1.84 | 2.25 |
| 16 | 3.52 | 4.45 | 16 | 1.69 | 2.89 |
| 17 | 3.40 | 4.85 | 17 | 1.80 | 2.51 |
| 18 | 3.66 | 4.80 | 18 | 1.61 | 2.38 |
| 19 | 3.59 | 4.27 | 19 | 1.42 | 3.05 |
| 20 | 4.02 | 4.70 | 20 | 2.02 | 3.26 |
| 21 | 3.40 | 4.50 | 21 | 2.00 | 2.45 |
| 22 | 3.98 | 4.89 | 22 | 1.61 | 3.02 |
| 23 | 3.61 | 4.49 | 23 | 1.96 | 1.85 |
| 24 | 4.21 | 5.02 | 24 | 1.58 | 2.29 |
| 25 | 3.52 | 4.89 | 25 | 1.56 | 2.43 |
| AVERAGE VALUE | 3.67 | 4.69 | AVERAGE VALUE | 1.75 | 2.57 |

SAMPLE SHOT REGION

NON-SAMPLE SHOT REGION IN WHICH STANDARD DEVIATION EXCEEDS THRESHOLD

NON-SAMPLE SHOT REGION

F I G. 8
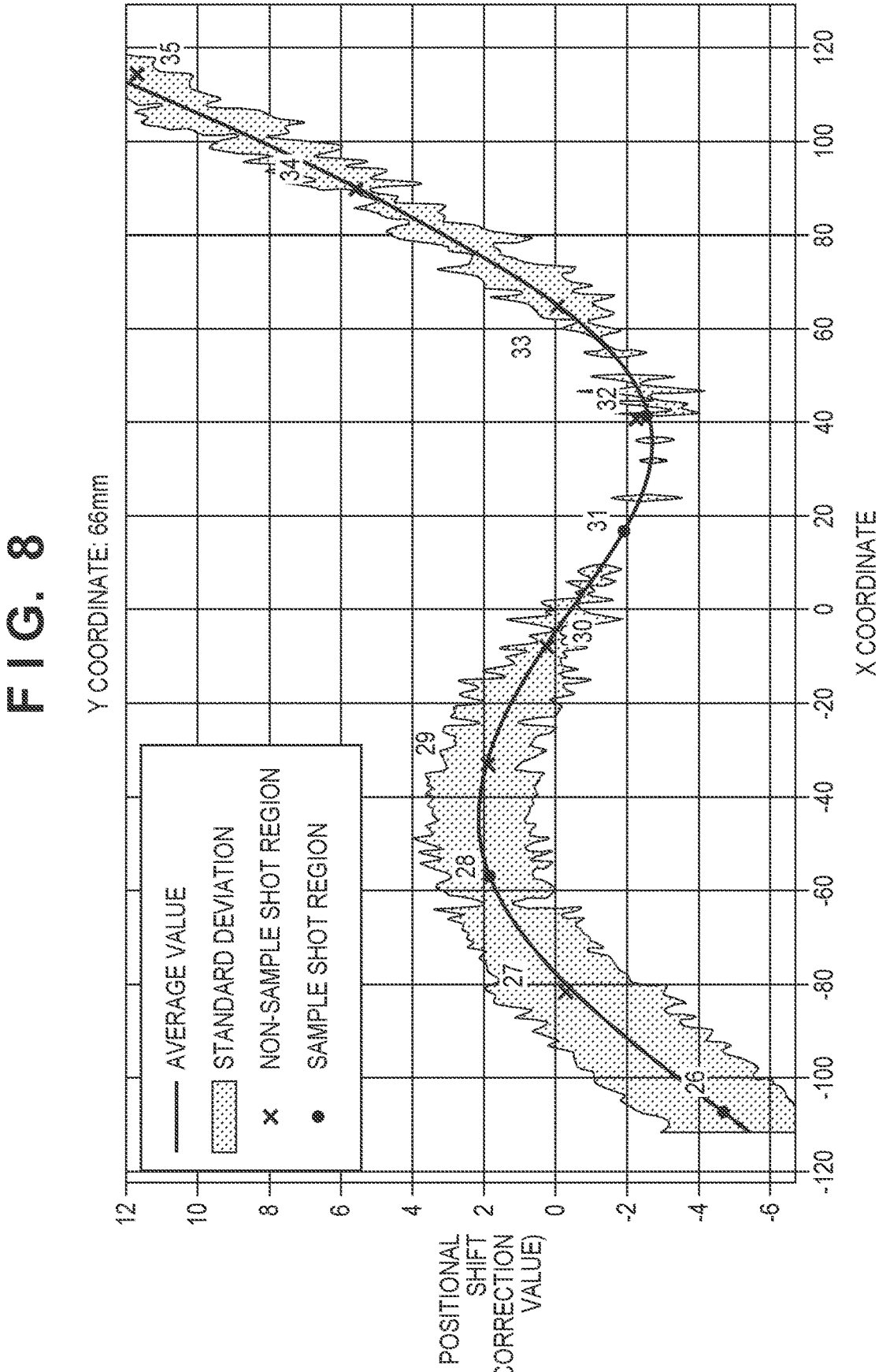
Y COORDINATE: 66mm
AVERAGE VALUE
STANDARD DEVIATION
✕  NON-SAMPLE SHOT REGION
●  SAMPLE SHOT REGION
X COORDINATE
POSITIONAL SHIFT (CORRECTION VALUE)

METHOD OF OBTAINING ARRAY OF PLURALITY OF REGIONS ON SUBSTRATE, EXPOSURE METHOD, EXPOSURE APPARATUS, METHOD OF MANUFACTURING ARTICLE, NON-TRANSITORY COMPUTER-READABLE STORAGE MEDIUM, AND INFORMATION PROCESSING APPARATUS

BACKGROUND OF THE INVENTION

Field of the Invention

The present invention relates to a method of obtaining an array of a plurality of regions on a substrate, an exposure method, an exposure apparatus, a method of manufacturing an article, a non-transitory computer-readable storage medium, and an information processing apparatus.

Description of the Related Art

An exposure apparatus overlays 10 or more layers of patterns (circuit patterns) and transfers these to a substrate. If the overlay accuracy of the patterns between the layers is not high, inconvenience may occur in the circuit characteristic. In this case, a chip cannot satisfy a predetermined characteristic and becomes defective, resulting in a low yield. It is therefore necessary to accurately position (align) each of the plurality of regions to be exposed and the pattern of an original on the substrate.

In the exposure apparatus, an alignment mark arranged in each region on the substrate is detected, and each region on the substrate is aligned with the pattern of the original based on the position information of the alignment mark and the position information of the pattern of the original. Ideally, when alignment mark detection is performed for all regions on the substrate, most accurate alignment can be performed. However, this is not realistic from the viewpoint of productivity. To cope with this, the current mainstream of an alignment method for a substrate and an original is a global alignment method as disclosed in Japanese Patent Laid-Open No. 62-84516.

In the global alignment method, assuming that the relative position of each region on a substrate can be expressed by a function model of the position coordinates of the region, the positions of alignment marks arranged only in a plurality of (4 to 16) sample regions on the substrate are measured. Next, the parameter of the function model are estimated, using regression analysis-like statistic operation processing, from the assumed function model and the measurement result of the alignment mark positions. Using the parameter and the function model, the position coordinates of each region on a stage coordinate system (the array of the regions on the substrate) are calculated, thereby performing alignment. As disclosed in Japanese Patent Laid-Open No. 6-349705, in the global alignment method, a polynomial model using stage coordinates as variables is used in general, and scaling that is a first-order polynomial of stage coordinates, rotation, uniform offset, and the like are mainly used. A technique using a regression model that considers, as a parameter, even a high-order component of the array of regions on the substrate is also proposed in Japanese Patent No. 3230271.

Along with the progress of miniaturization and integration of devices, the alignment accuracy is required to be improved. For this reason, the degree of freedom of the function model needs to be increased by using a higher-order component as the degree of the polynomial of the function model. However, if the number of measurement points to measure the positions of alignment marks in a substrate is small relative to the degree of freedom of the function model, overfitting occurs, and correction errors of unmeasured regions increase. On the other hand, if the number of measurement points to measure the positions of alignment marks is increased to suppress the overfitting, the measurement time increases, and the productivity lowers. Since these have a tradeoff relationship, there is demanded a technique capable of accurately predicting the array of regions on a substrate including a high-order component using a small number of measurement points and a function model of a high degree of freedom.

SUMMARY OF THE INVENTION

The present invention provides a technique advantageous in accurately obtaining the array of regions on a substrate.

According to one aspect of the present invention, there is provided a method of obtaining an array of a plurality of regions on a substrate, including obtaining position measurement data by measuring a mark assigned to each sample region among the plurality of regions on the substrate, and estimating a position of each non-measurement region excluding the sample region among the plurality of regions by using a regression model used to estimate the array from the position measurement data, wherein the regression model is a nonparametric regression model.

Further aspects of the present invention will become apparent from the following description of exemplary embodiments with reference to the attached drawings.

BRIEF DESCRIPTION OF THE DRAWINGS

FIG. 1 is a schematic view illustrating configurations of an exposure apparatus according to an aspect of the present invention.

FIG. 2 is a schematic view illustrating configurations of the alignment optical system of the exposure apparatus shown in FIG. 1.

FIG. 3 is a flowchart for explaining exposure processing of the exposure apparatus shown in FIG. 1.

FIG. 4 is a view showing the array of shot regions on a substrate.

FIG. 5A, FIG. 5B and FIG. 5C are views including tables showing comparison results between the embodiment and a conventional technique.

FIG. 8 is a view showing an example of a screen displayed as a user interface.

DESCRIPTION OF THE EMBODIMENTS

Figure 6:
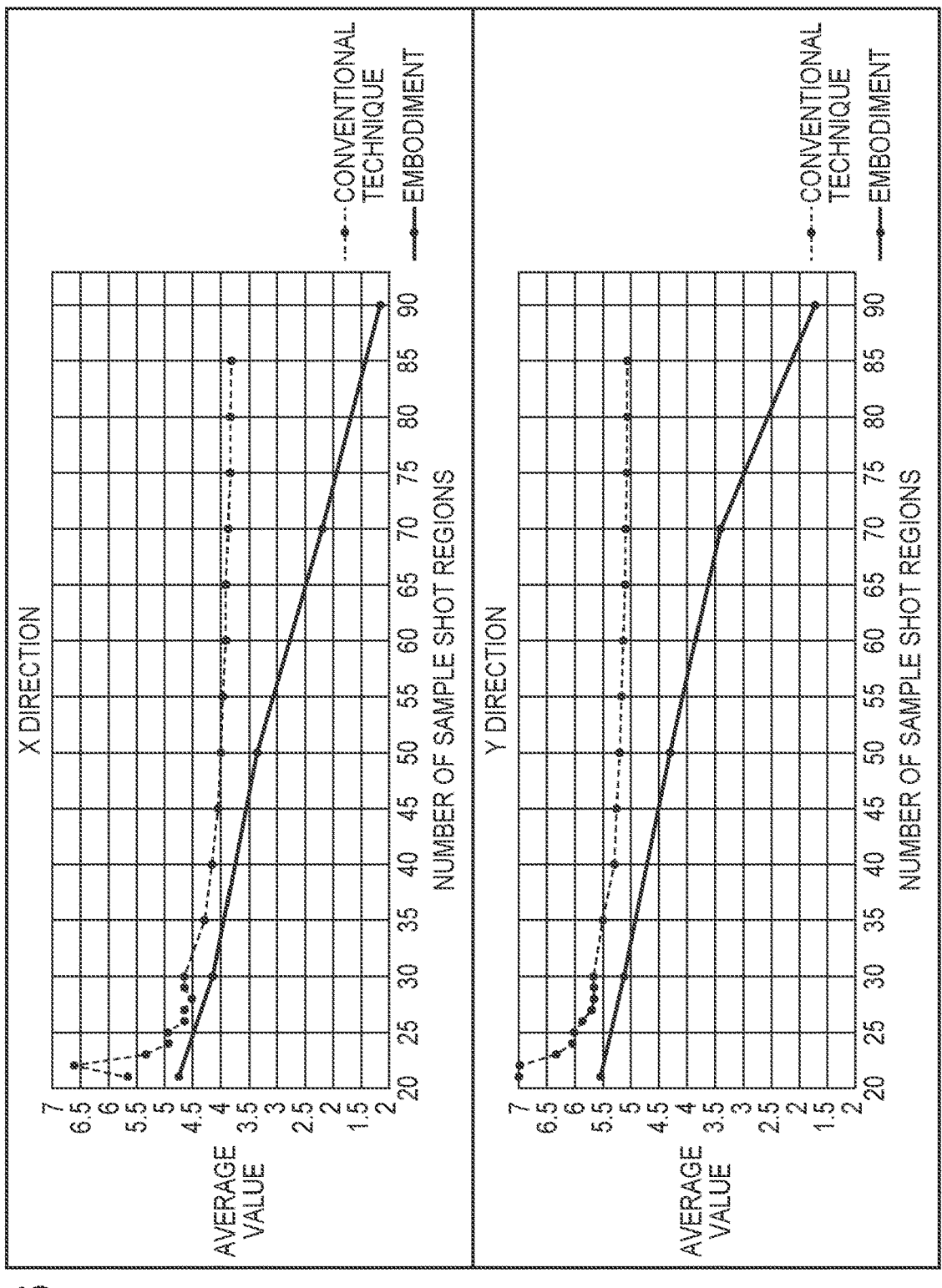
FIG. 6 is a view including tables showing comparison results between the embodiment and a conventional technique.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating configurations of an exposure apparatus 1 according to an aspect of the present invention. The exposure apparatus 1 is a lithography apparatus used in the manufacturing process of a device such as a semiconductor element. In this embodiment, the exposure apparatus 1 projects the pattern of an original 2 (a reticle or a mask) onto a substrate 4 via a projection optical system 3, and exposes the substrate 4.

As shown in FIG. 1, the exposure apparatus 1 includes the projection optical system 3 that projects (reduction-projects) a pattern formed on the original 2, and a chuck 5 that holds the substrate 4 on which a base pattern or an alignment mark is formed by a preprocess. The exposure apparatus 1 also includes a substrate stage 6 that holds the chuck 5 and positions the substrate 4 at a predetermined position, an alignment optical system 7 that measures the position of an alignment mark provided on the substrate 4, a control unit CN, a storage unit SU, and a display unit DP.

The control unit CN is formed by, for example, a computer (information processing apparatus) including a CPU, a memory, and the like, and comprehensively controls the units of the exposure apparatus 1 in accordance with a program stored in the storage unit SU or the like. In this embodiment, in addition to controlling exposure processing of exposing the substrate 4 via the original 2, the control unit CN functions as a processing unit configured to obtain the array (shot array or region array) of a plurality of shot regions on the substrate (a plurality of regions on the substrate).

The storage unit SU stores a program and various kinds of information (data) necessary to execute exposure processing of exposing the substrate 4 by controlling the units of the exposure apparatus 1. The storage unit SU also stores a program and various kinds of information (data) necessary for the control unit CN to obtain the shot array.

The display unit DP is a display apparatus used to display various kinds of information regarding the exposure apparatus 1. In this embodiment, the display unit DP includes a touch panel. In this case, the display unit DP displays various kinds of user interfaces (screens), and accepts operations from the user.

FIG. 2 is a schematic view illustrating configurations of the alignment optical system 7. The alignment optical system 7 has a function of optically detecting a mark assigned to each shot region on the substrate 4 and obtaining position measurement data. In this embodiment, the alignment optical system 7 includes a light source 8, a beam splitter 9, lenses 10 and 13, and a sensor 14.

Light from the light source 8 is reflected by the beam splitter 9 and illuminates, via the lens 10, an alignment mark 11 or 12 provided on the substrate 4. The light diffracted by the alignment mark 11 or 12 is received by the sensor 14 via the lens 10, the beam splitter 9, and the lens 13.

Exposure processing by the exposure apparatus 1 will be described with reference to FIG. 3. The steps until the substrate 4 is aligned and exposed will be described here.

In step S301, the substrate 4 is loaded into the exposure apparatus 1. The substrate 4 loaded into the exposure apparatus 1 is held by the chuck 5.

In step S302, pre-alignment is executed. More specifically, the alignment mark 11 for pre-alignment provided on the substrate 4 is detected by the alignment optical system 7, thereby roughly obtaining the position of the substrate 4. At this time, detection of the alignment mark 11 is performed for a plurality of shot regions on the substrate 4, and the shift and the first-order linear component (magnification or rotation) of the entire substrate 4 are obtained.

In step S303, fine alignment is executed. More specifically, first, based on the result of pre-alignment, the substrate stage 6 is driven to a position where the alignment mark 12 for fine alignment provided on the substrate 4 can be detected by the alignment optical system 7. Then, the alignment mark 12 provided in each sample shot region among the plurality of shot regions on the substrate 4 is detected by the alignment optical system 7 to obtain the position measurement data of the alignment mark 12.

In step S304, based on the position measurement data of the alignment marks 12 (the pieces of alignment mark information of the sample shot regions) obtained in step S303, the shift and the first-order linear component (magnification or rotation) of the entire substrate 4 is accurately obtained. At this time, in this embodiment, the alignment mark information of each non-sample shot region is estimated from the pieces of alignment mark information of the sample shot regions obtained by fine alignment. In other words, the position measurement data in each shot region other than the sample shot region, that is, each non-sample shot region whose alignment mark 12 has not been detected (the position of each unmeasured region excluding the sample shot regions) is estimated. As the regression model for estimating the position measurement data in the non-sample shot region, a nonparametric regression model is used. With this, the high-order deformation component of the substrate 4 can be accurately obtained from the position measurement data (measurement values) in the sample shot regions and the position measurement data (estimation values) in the non-sample shot regions. Accordingly, the accurate position of each shot region on the substrate 4, that is, the shot array can be obtained, and accurate alignment of each shot region on the substrate 4 can be performed.

In step S305, the substrate 4 is exposed. More specifically, the substrate stage 6 is driven based on the accurate position of each shot region on the substrate 4 obtained by executing the fine alignment, and the pattern of the original 2 is transferred to each shot region on the substrate 4 via the projection optical system 3.

In step S306, the substrate 4 is unloaded from the exposure apparatus 1.

Here, as the regression model used to accurately obtain the high-order deformation component of the substrate 4, a polynomial linear regression model, which is one of parametric regression models, has conventionally been known. In the following description, as a conventional technique, a cubic polynomial linear regression model (cubic polynomial regression model) will be described.

When the deformation of the substrate 4 is expressed by a cubic polynomial regression model, the positional shifts (ShiftX, ShiftY) of each shot region are expressed by equations (1) below. Note that the positional shift of each shot region can also be considered as a correction value used to correct the positional shift.

$$ShiftX = \tag{1}$$
$$k_1 + k_3x + k_5y + k_7x^2 + k_9xy + k_{11}y^2 + k_{13}x^3 + k_{15}x^2y + k_{17}xy^2 + k_{19}y^3$$
$$ShiftY =$$
$$k_2 + k_4y + k_6x + k_8y^2 + k_{10}xy + k_{12}x^2 + k_{14}y^3 + k_{16}xy^2 + k_{18}x^2y + k_{20}x^3$$

In equations (1), x and y indicate the positions of each shot region on the substrate 4. Coefficients $k_1$ to $k_{20}$ in equations (1) are decided from the actual position measurement data of each shot region (position measurement data in each sample shot region) on the substrate 4. Then, the positional shift of each shot region is obtained based on equations (1) with the decided coefficients.

As has been described above, in fine alignment, the actual position measurement data of each shot region on the substrate 4 is obtained. For example, as shown in FIG. 4, the alignment optical system 7 detects the alignment marks 12 assigned to some shot regions, that is, so-called sample shot regions (sample regions) among the plurality of shot regions on the substrate. In FIG. 4, among 96 shot regions on the substrate, 23 shot regions are set as sample shot regions. To correct the high-order deformation component of the substrate 4, a lot of shot regions need to be set to sample shot regions. However, an increase in the number of sample shot regions and the measurement time (alignment time) have a tradeoff relationship. Hence, in fact, the number of sample shot regions is decided in consideration of the productivity of devices.

As has been described above, in the conventional technique, a polynomial linear regression model as a parametric regression model is used to accurately obtain the high-order deformation component of the substrate 4. On the other hand, in this embodiment, the high-order deformation component of the substrate 4 is accurately obtained by using not the parametric regression model but a nonparametric regression model.

Hereinafter, comparison results between this embodiment (a case of using a nonparametric regression model) and the conventional technique (a case of using a parametric regression model) will be described. Here, a Gaussian process regression model is used as the nonparametric regression model in this embodiment, and a fifth-order polynomial linear regression model (fifth-order polynomial regression model) is used as the parametric regression model in the conventional technique. Note that the nonparametric regression model is not limited to the Gaussian process regression model, and may be, for example, a kernel regression model, a spline regression model, a neighbors regression model, or the like.

FIG. 5A, FIG. 5B and FIG. 5C are views including tables showing regression errors 3σ (the overall errors of the substrate) of each substrate in a case of applying this embodiment to the semiconductor exposure process, and the regression errors 3σ of each substrate in a case of applying the conventional technique. In FIG. 5A, FIG. 5B and FIG. 5C, the regression errors 3σ of each substrate in the X direction and the Y direction, respectively, are shown. FIG. 5A, FIG. 5B and FIG. 5C show comparison results obtained when the number of sample shot regions to detect the alignment marks among the plurality of shot regions on the substrate is set to 30, 50, and 70.

With reference to FIG. 5A, FIG. 5B and FIG. 5C, it can be seen that, in both of comparison of the regression error 3σ for each substrate and comparison of the average value of the regression errors 3σ of the substrates in a lot, better results are obtained in this embodiment using the Gaussian process regression model than in the conventional technique using the fifth-order polynomial regression model.

FIG. 6 is a view including tables showing the average value of the regression errors 3σ of each of 250 substrates corresponding to the number of sample shot regions in each of the case of applying this embodiment to the semiconductor exposure process and the case of applying the conventional technique. In FIG. 6, the average value of the regression errors 3σ of each of 250 substrates corresponding to the number of sample shot regions in each of the X direction and the Y direction is shown. In FIG. 6, the abscissa represents the number of sample shot regions, and the ordinate represents the average value of the regression errors 3σ. The solid line represents this embodiment using the Gaussian process regression model, and the dotted line represents the conventional technique using the fifth-order polynomial regression model.

With reference to FIG. 6, it can been seen that, in comparison of any value, better results are obtained in this embodiment using the Gaussian process regression model than in the conventional technique using the fifth-order polynomial regression model, regardless of the number of sample shot regions. As the number of sample shot regions increases, the average value of the regression errors 3σ decreases in this embodiment (Gaussian process regression model), and the improvement effect increases as compared to the conventional technique (fifth-order polynomial regression model). Further, in the conventional technique (fifth-order polynomial regression model), when the number of sample shot regions is small, there is a tendency for the average value of the regression errors 3σ to largely decrease due to occurrence of overfitting. On the other hand, in this embodiment (Gaussian process regression model), even when the number of sample shot regions is small, no overfitting occurs, and there is no tendency for the average value of the regression errors 3σ to decrease.

In this manner, according to this embodiment, by using the nonparametric regression model, it is possible to accurately estimate the position of each non-sample shot region whose alignment mark has not been detected, thereby obtaining the accurate position of each shot region on the substrate 4, that is, the shot array.

In this embodiment, in the Gaussian process regression model used as the nonparametric regression model, the kernel function and hyper parameter used in the regression model need to be decided. In this embodiment, the kernel function and hyper parameter in the Gaussian process regression model are obtained in advance by using grid search, but the present invention is not limited to this. For example, the kernel function and hyper parameter in the Gaussian process regression model may be decided using machine learning, more specifically, a Markov Chain Monte Carlo method (MCMC method) or a gradient method.

Further, in the Gaussian process regression model, in addition to the position of the non-sample shot region whose alignment mark has not been detected, the standard deviation of the distribution (distribution of predicted value) can be obtained. The standard deviation represents the uncertainty of the position of the non-sample shot region (the error at each position in the substrate) estimated using the Gaussian process regression model. Accordingly, if the standard deviation of the distribution (prediction distribution) of the position of the non-sample shot region estimated using the Gaussian process regression model exceeds a threshold (specific value), the alignment mark of this non-sample shot region may be detected to obtain the actual position measurement data. With this, the high-order deformation component (shot array) of the substrate 4 can be accurately obtained from the position measurement data (measurement values) in the sample shot regions and the position measurement data (measurement values) in the non-sample shot regions.

In the exposure apparatus 1, information regarding the position of the non-sample shot region estimated from the nonparametric regression model such as the Gaussian process regression model may be provided so that the user can visually check (grasp) it. In this embodiment, the control unit CN displays (provides), on the display unit DP, a user interface for displaying information regarding the position of the non-sample shot region. Information regarding the position of the non-sample shot region includes, for example, information indicating the position of the non-sample shot region estimated using the Gaussian process regression model, and information indicating the standard deviation of the distribution of the position of the non-sample shot region estimated using the Gaussian process regression model.

Figure 7:
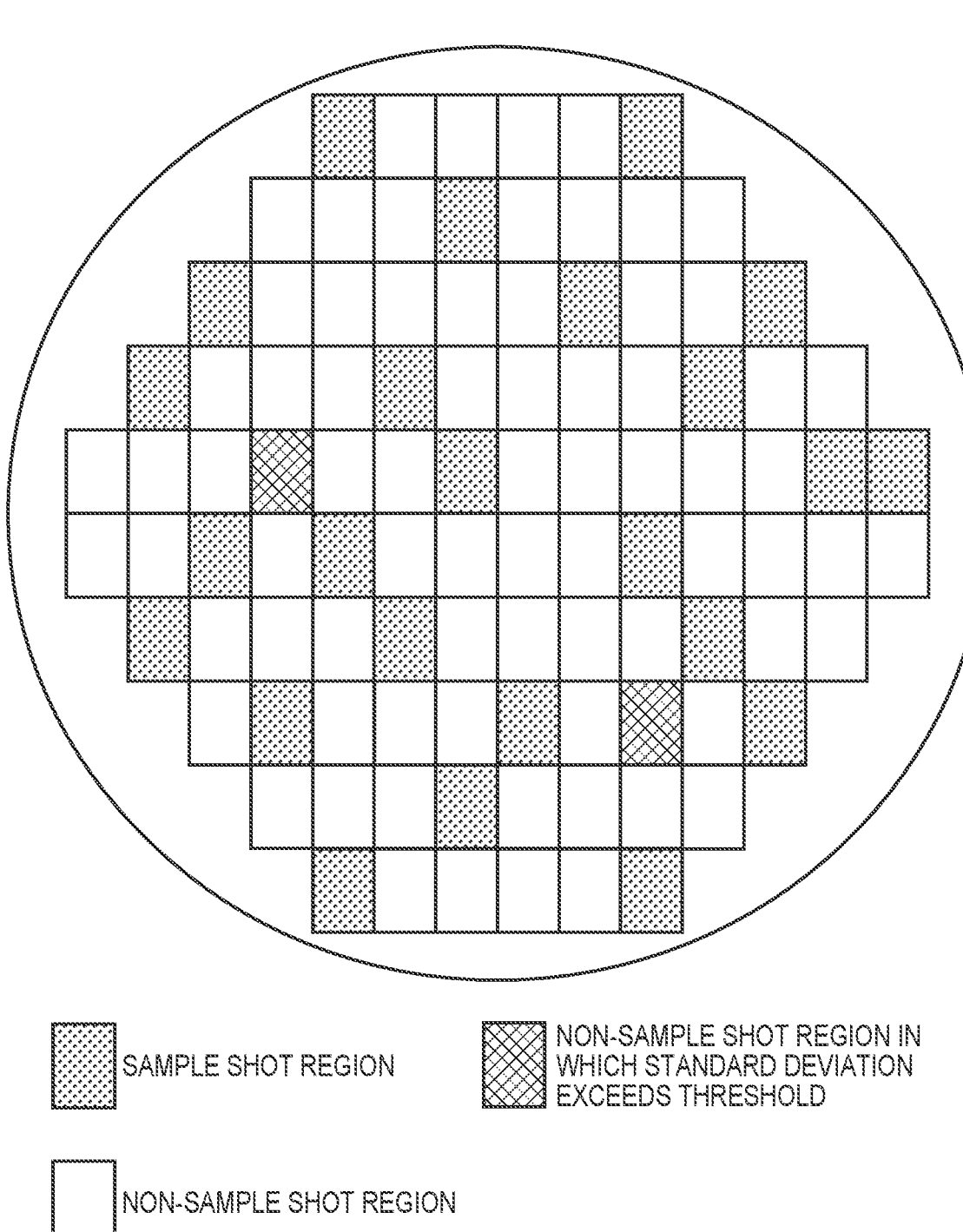
FIG. 7 is a view showing an example of a screen displayed as a user interface.

FIGS. 7 and 8 are views each showing an example of a screen for displaying information regarding the position of the non-sample shot region estimated from the regression model, which is displayed as a user interface on the display unit DR In FIG. 7, the positions of the non-sample shot regions estimated using the Gaussian process regression model are displayed as an image together with the positions of the sample shot regions. Further, in FIG. 7, among the non-sample shot regions, a non-sample shot region having the standard deviation of the distribution of the position of the non-sample shot region estimated using the Gaussian process regression model exceeding a threshold is identifiably displayed, for example, highlighted with color or the like. On the other hand, in FIG. 8, the positions of the non-sample shot regions estimated using the Gaussian process regression model are displayed as a graph together with the positions of the sample shot regions. Further, in FIG. 8, the average value and standard deviation of the distribution of the position of each non-sample shot region estimated using the Gaussian process regression model are also displayed.

It may be configured that the user interfaces shown in FIGS. 7 and 8 are displayed not only by the control unit CN of the exposure apparatus 1 but also by an external computer (information processing apparatus). The external computer is communicably connected to the exposure apparatus 1 (control unit CN), and includes a processing unit, a display unit, a storage unit, and an input unit. The external computer displays (provides) the user interfaces shown in FIGS. 7 and 8 on the display unit in accordance with a program stored in the storage unit or the like. In accordance with the above-described method, the external computer obtains information regarding position measurement data, and estimates information regarding the position of the non-sample shot region by using the Gaussian process regression model.

As has been described above, when information regarding the position of a non-sample shot region estimated from a nonparametric regression model such as a Gaussian process regression model is displayed as an image or a graph, the user can visually perceive the high-order deformation component (shot array) of the substrate 4. Accordingly, in accordance with the certainty of the position of the non-sample shot region estimated from the nonparametric regression model, the user can easily determine to change the number and arrangement of sample shot regions.

A method of manufacturing an article according to the embodiment of the present invention is suitable for manufacturing an article, for example, a liquid crystal display element, a semiconductor element, a flat panel display, or a MEMS. The manufacturing method includes a process of exposing, using the above-described exposure apparatus 1 or exposure method, a substrate to which a photoresist is applied, and a process of developing the exposed photoresist. In addition, an etching process, an ion implantation process, and the like are performed for the substrate using the pattern of the developed photoresist as a mask, thereby forming a circuit pattern on the substrate. By repeating the processes of exposure, development, etching, and the like, a circuit pattern formed by a plurality of layers is formed on the substrate. In the post-process, dicing (processing) is performed for the substrate on which the circuit pattern is formed, and chip mounting, bonding, and inspection processes are performed. The manufacturing method can also include other known processes (for example, oxidation, deposition, vapor deposition, doping, planarization, and resist removal). The method of manufacturing an article according to this embodiment is advantageous in at least one of the performance, quality, productivity, and production cost of the article, as compared to conventional methods.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

In this embodiment, as a lithography apparatus for forming a pattern on a substrate, an exposure apparatus has been described as an example. However, the present invention is not limited to this. For example, the lithography apparatus includes an imprint apparatus that forms a pattern on a substrate by molding, using a mold, an imprint material on the substrate, a planarization apparatus that planarizes a composition on a substrate using a mold with a flat surface, and the like. The lithography apparatus also includes a drawing apparatus that draws a pattern on a substrate using a charged particle beam (such as an electron beam or an ion beam).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2023-028844 filed on Feb. 27, 2023, which is hereby incorporated by reference herein in its entirety.

What is claimed is:

1. A method of obtaining an array of a plurality of regions on a substrate, comprising:

obtaining position measurement data by measuring a mark assigned to each sample region among the plurality of regions on the substrate; and estimating a position of each non-measurement region excluding the sample region among the plurality of regions by using a regression model used to estimate the array from the position measurement data, wherein the regression model is a nonparametric regression model;

determining, for each non-measurement region, a standard deviation of a distribution of the position of the non-measurement region estimated from the regression model; and if the standard deviation for a non-measurement region exceeds a threshold, obtaining position measurement data by measuring a mark assigned to the non-measurement region, and obtaining the array from (i) the position measurement data of the sample region, and (ii) the position measurement data obtained for the non-measurement region for which the standard deviation exceeds the threshold.

2. The method according to claim 1, further comprising obtaining the array from the position measurement data and the position of the non-measurement region estimated from the regression model.

3. The method according to claim 1, wherein the nonparametric regression model includes a Gaussian process regression model.

4. The method according to claim 3, wherein a kernel function and a hyper parameter in the Gaussian process regression model are decided by machine learning.

5. The method according to claim 4, wherein the machine learning includes one of a Markov Chain Monte Carlo method and a gradient method.

6. An exposure method of exposing a substrate via an original, comprising:

obtaining an array of a plurality of regions on a substrate by using a method defined in claim 1; and transferring a pattern of the original to each of the plurality of regions while positioning the substrate based on the array obtained in the obtaining.

7. A method of manufacturing an article, comprising:

exposing a substrate using an exposure method defined in claim 6;

developing the exposed substrate; and manufacturing the article from the developed substrate.

8. An information processing apparatus executing a method defined in claim 1.

9. An exposure apparatus for exposing a substrate via an original, comprising:

a processing unit configured to obtain an array of a plurality of regions on a substrate; and a stage configured to position the substrate based on the array obtained by the processing unit, wherein the processing unit obtains position measurement data by measuring a mark assigned to each sample region among the plurality of regions on the substrate, and estimates a position of each non-measurement region excluding the sample region among the plurality of regions by using a regression model used to estimate the array from the position measurement data, and determines, for each non-measurement region, a standard deviation of a distribution of the position of the non-measurement region estimated from the regression model, and if the standard deviation for a non-measurement region exceeds a threshold, obtains position measurement data by measuring a mark assigned to the non-measurement region, and obtaining the array from (i) the position measurement data of the sample region, and (ii) the position measurement data obtained for the non-measurement region for which the standard deviation exceeds the threshold, and the regression model is a nonparametric regression model.

10. The apparatus according to claim 9, wherein the processing unit provides a user interface configured to display information regarding the position of the non-measurement region estimated from the regression model.

11. The apparatus according to claim 10, wherein the nonparametric regression model includes a Gaussian process regression model, and the information includes information indicating the position of the non-measurement region, and information indicating a standard deviation of a distribution of the position of the non-measurement region estimated from the regression model.

12. The apparatus according to claim 11, wherein the processing unit identifiably displays, in the user interface, a non-measurement region having the standard deviation exceeding a threshold among the non-measurement regions.

13. A non-transitory computer-readable storage medium storing a program configured to cause a computer to execute a method of obtaining an array of a plurality of regions on a substrate, the program causing the computer to execute obtaining position measurement data by measuring a mark assigned to each sample region among the plurality of regions on the substrate, and estimating a position of each non-measurement region excluding the sample region among the plurality of regions by using a regression model used to estimate the array from the position measurement data, wherein the regression model is a nonparametric regression model determining, for each non-measurement region, a standard deviation of a distribution of the position of the non-measurement region estimated from the regression model; and if the standard deviation for a non-measurement region exceeds a threshold, obtaining position measurement data by measuring a mark assigned to the non-measurement region, and obtaining the array from (i) the position measurement data of the sample region, and (ii) the position measurement data obtained for the non-measurement region for which the standard deviation exceeds the threshold.

14. An information processing apparatus, wherein the apparatus is configured to obtain position measurement data obtained by measuring a mark assigned to a sample region among a plurality of regions on a substrate, estimate a position of a non-measurement region excluding the sample region among the plurality of regions by using a regression model used to estimate an array of the plurality of regions from the position measurement data, determines, for each non-measurement region, a standard deviation of a distribution of the position of the non-measurement region estimated from the regression model, and if the standard deviation for a non-measurement region exceeds a threshold, obtains position measurement data by measuring a mark assigned to the non-measurement region, and obtaining the array from (i) the position measurement data of the sample region, and (ii) the position measurement data obtained for the non-measurement region for which the standard deviation exceeds the threshold, and provide a user interface configured to display information regarding the position of the non-measurement region estimated from the regression model, and the regression model is a nonparametric regression model.

15. The apparatus according to claim 14, wherein the nonparametric regression model includes a Gaussian process regression model, and the information includes information indicating the position of the non-measurement region, and information indicating a standard deviation of a distribution of the position of the non-measurement region estimated from the regression model.

16. The apparatus according to claim 15, wherein a non-measurement region having the standard deviation exceeding a threshold among the non-measurement regions is identifiably displayed in the user interface.

* * * * *